United States Patent [19]

Fukushima et al.

[11] Patent Number: 4,460,953
[45] Date of Patent: Jul. 17, 1984

[54] SIGNAL VOLTAGE DIVIDING CIRCUIT

[75] Inventors: Isao Fukushima; Kazuyoshi Kuwahara; Hideo Nishijima; Yasunori Kobori; Keiichi Itoigawa, all of Katsuta, Japan

[73] Assignees: Hitachi, Ltd.; Hitachi Microcomputer Engineering, Ltd., both of Tokyo, Japan

[21] Appl. No.: 375,585

[22] Filed: May 6, 1982

[30] Foreign Application Priority Data

| May 8, 1981 | [JP] | Japan | 56-68367 |
| May 8, 1981 | [JP] | Japan | 56-68370 |
| Jun. 12, 1981 | [JP] | Japan | 56-89674 |
| Jun. 12, 1981 | [JP] | Japan | 56-89675 |

[51] Int. Cl.³ .................................................. H02M 3/06
[52] U.S. Cl. .................................................. 363/62; 320/1
[58] Field of Search .................................................. 363/59–62; 307/109, 110; 320/1

[56] References Cited

U.S. PATENT DOCUMENTS

| 3,041,479 | 6/1962 | Sikorra | 307/110 X |
| 3,919,699 | 11/1975 | Hideshima | 320/1 |
| 4,137,464 | 1/1979 | Heller et al. | 320/1 X |
| 4,205,369 | 5/1980 | Asano | 363/62 |

Primary Examiner—Peter S. Wong
Attorney, Agent, or Firm—Antonelli, Terry & Wands

[57] ABSTRACT

A signal voltage dividing circuit in which two switched capacitors each including an input terminal, an output terminal and a capacitor connected selectively to the input terminal or the output terminal are connected in series and driven in opposite phase with each other. A holding capacitor is connected between the junction of the two switched capacitors and a reference potential. An input signal is supplied across the two switched capacitors to produce a divided output signal from the junction of the two switched capacitors.

10 Claims, 12 Drawing Figures

SIGNAL VOLTAGE DIVIDING CIRCUIT

The present invention relates to a signal voltage dividing circuit in which a plurality of resistors are connected in series to produce a divided signal from a junction between the resistors, and more particularly to a signal voltage dividing circuit in which the plurality of resistors are composed of switched capacitors.

There is a signal voltage dividing circuit in which two resistors are connected in series and a signal is supplied to the two resistors to produce an output signal from the junction between the two resistors. Such a signal voltage dividing circuit is shown in FIG. 1. In FIG. 1, a reference numeral 3 denotes a signal input terminal connected to one end of a resistor 1, a terminal 4 is an output terminal connected to the junction between two resistors 1 and 2, and a reference numeral 11 denotes a load connected to the output terminal 4. If the resistance values of the resistors 1 and 2 are $R_1$ and $R_2$, respectively, in this circuit, the input signal supplied to the input terminal 3 is divided in a ratio of $R_2/(R_1+R_2)$ to be produced from the output terminal 4. The load resistance 11 is selected to have a sufficiently large value as compared with the impedance of the circuit seen from the side of the output terminal 4. If such a circuit is considered to be included in an integrated circuit (IC), it is occasionally necessary to divide the signal by the resistors having a large resistance value because of a large impedance of a signal source applied to the input terminal 3 and a reduced direct current loss due to direct drive. In this case, the integrated circuit is required to build-in the resistances with the high resistance value and divide the signal with high accuracy. However, there is less realization, since the high-resistance resistors not only need a large area in the integrated circuit chip but also the occupation area in the chip is increased in order to improve the accuracy of the voltage division. Therefore, a few conventional integrated circuits include a voltage dividing circuit formed of resistors of 100 KΩ or more.

There is known a switched capacitor circuit including one capacitor and one switch in obtaining one equivalent resistor. FIG. 2 shows a principle diagram of the switched capacitor. In FIG. 2, numeral 7 denotes a switch, one stationary contact 18 of which is connected to one terminal 5 and the other stationary contact 19 of which is connected to the other terminal 6. A movable contact 30 of the switch 7 is connected to ground through a capacitor 8.

The switch 7 is on-off controlled by a clock signal 9. When the movable contact 30 of the switch 7 is connected to the stationary contact 18, the voltage of the terminal 5 is instantly charged on the capacitor 8. If the voltages at the terminals 5 and 6 are $V_1$ and $V_2$, respectively, the clock period T, the clock frequency f, and the capacitance value C, the electrical charge stored on the capacitor 8 when the contact 30 of the switch 7 is connected to the terminal 5 through the contact 18 is $CV_1$ and the electrical charge stored on the capacitor 8 when the contact 30 of the switch 7 is connected to the terminal 6 through the contact 19 is $CV_2$. Thus, the mobility per unit time of the electrical charge, i.e., the electric current I is given by:

$$I=C/T(V_1-V_2)$$

Therefore, an equivalent resistance expressed by the following equation (1) is to be inserted between the terminals 5 and 6.

$$Req=(V_1-V_2)/I=1/Cf=T/C \quad (1)$$

In this equation, since the equivalent resistance Req is an inverse value of the product of the clock frequency f and the capacitance C, the less the capacitance is, the higher the resistance can be realized, resulting in a small occupation area of the integrated circuit chip. For example, when the clock frequency is 100 KHz and the capacitance 1 PF, the equivalent resistance is 10 MΩ.

As described above, the switched capacitor including a small capacitor and a switch provides a high resistance by using a small capacitance capacitor if the clock frequency is selected suitably. Therefore, a combination of the switched capacitors can constitute a volage dividing circuit formed of resistors in principle. Further, the dividing ratio can be defined by the capacitance ratio, realizing the circuit with high accuracy as compared with the high-resistance resistors. That is, if a division of ten to one is effected by the capacitors 1 PF and 10 PF and the clock frequency is 100 KHz, the division of 10 MΩ to 1 MΩ can be made. The capacitor ratio in such a degree can be easily realized with a tolerance of ±10%. However, heretofore, the switched capacitor is merely applied to a filter circuit with various time constants realized by combination with an operational amplifier. The resistor division method and the connecting method of the series-connected resistors using the switched capacitors have never been cleared. That is, desired series resistance values with a desired division ratio can not be obtained by merely combining the switched capacitors.

For example, as shown in FIG. 3, suppose that switches for composing switched capacitors are operated in phase. Throughout the drawings, like reference numerals are used to designate components having the identical function with that of the components in FIGS. 1 and 2. In this figure, suppose that the electrical charge of each capacitor is first zero. When the contact 30 of the switch 7 is connected to the contact 18 by the clock signal 9 to connect one end of the capacitor 8 to the terminal 5, one end of the capacitor 15 is also connected to the terminal 12 through the contact 10 of the switch 14. At this time, the capacitor 8 is charged by the voltage $V_1$ of the terminal 5, while the capacitor 15 is not charged since it is connected to ground through the terminals 12 and 4 and the load 11. During a half period of the next clock, the contact 30 of the switch 7 is connected to the terminal 6 and the contact 31 of the switch 14 is connected to the terminal 13. However, since the terminal 13 for the switch 14 is connected to ground and the switches 7 and 14 are controlled to be opened or closed in phase by the clock 9, there is no transfer of the electric charges between the capacitors 8 and 15. Consequently, the capacitor 8 is charged by the voltage of the terminal 5 during the half period of the clock and the charged voltage is discharged through the capacitance value of the capacitor 8 and the resistance value of the load resistance 11 during the next half period. This operation is merely repeated every clock period. Therefore, although the switched capacitor including the switch 14 and the capacitor 15 is just individually operated as a resistor, it is not operated as a part of the series resistor circuit or the signal voltage dividing circuit even if combining with the switched capacitor including the switch 7 and the capacitor 8.

The present invention is to provide a signal voltage dividing circuit including high-resistance resistors in an integrated circuit which cannot be included in the integrated circuit heretofore and for dividing a signal with high accuracy.

The signal voltage dividing circuit according to the present invention comprises two switched capacitors connected in series, each of which includes an input terminal, an output terminal and a capacitor connected selectively to the input terminal or the output terminal, the two switched capacitors being operated in opposite phase with each other, a holding capacitor connected to the junction between the two switched capacitors, and an input signal being supplied across the series-connected two switched capacitors to produce an output signal from the junction between the switched capacitors.

The present invention will be apparent from the following detailed description taken in conjunction with the accompanying drawings, in which.

Figure 4:
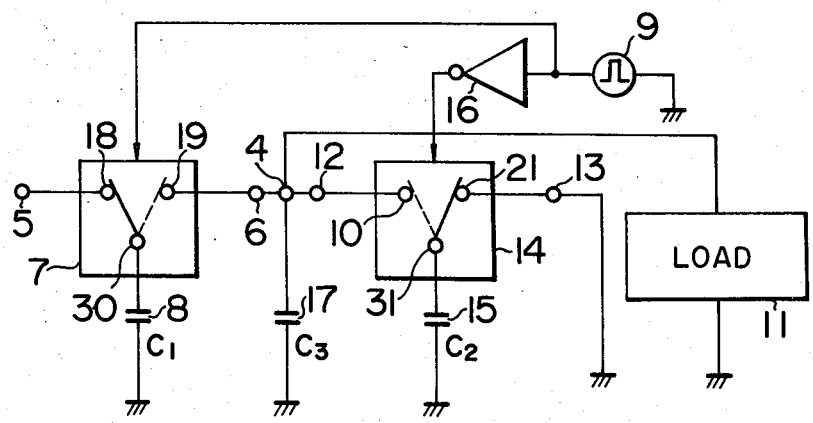
FIG. 4 is a circuit diagram showing one embodiment of the signal voltage dividing circuit according to the present invention.

Referring to FIG. 4 which is a block diagram showing one embodiment of the signal voltage dividing circuit according to the present invention, one stationary contact 18 of a first switch 7 is connected to a first terminal 5, the other stationary contact 19 of the switch 7 is connected to a second terminal 6, and a movable contact 30 of the switch 7 is connected to ground through a capacitor 8. One stationary contact 10 of a second switch 14 is connected to a third terminal 12, the other contact 21 of the switch 14 is connected to a fourth terminal 13, and a movable contact 31 of the switch 14 is connected to ground through a capacitor 15. The second terminal 6 and the third terminal 12 are connected in common to an output terminal 4 which is connected to a load 11 and also connected to ground through a holding capacitor 17. The fourth terminal 13 is directly connected to ground. One end of a clock signal generator 9 is connected to ground and the other end of the generator 9 to the first switch 18. The other end of the generator 9 is further connected through an inverter 16 to the second switch 14.

In such a circuit, the first and second switches 7 and 14 are switched by the output signal of the clock signal generator. Thus, the movable contact of the first switch 7 is alternately connected to the stationary terminal 18 or 19. The movable contact of the second switch 14 is also connected alternately to the stationary contact 10 or 21 by the clock pulse of the clock signal generator. In order to switch the switches 7 and 14 isn anti-phase with each other, the second switch 14 is supplied with the clock signal through the inverter 16, so the connecting relationship of the switches is as shown in the figure. If the capacitance values of the capacitors 8, 15 and 17, is $C_1$, $C_2$ and $C_3$ respectively, the voltage of the first terminal 5 is $V_1$, the voltage of the output terminal 4 is $V_2$, and the clock period is T, the charge $C_1V_1$ (nT) is stored on the capacitor 8 when the operating relationship of the stationary terminals 18–21 of the first and second switches 7 and 14 is as shown in the figure at time nT of the clock signal. The capacitor 17 is maintained in the state in which the charge of $C_3V_2(n-\frac{1}{2})T$ is stored on it by the voltage $V_2(n-\frac{1}{2})T$ which has developed on the output terminal 4 before a half period. When the movable contacts of the first and second switches 7 and 14 are connected to the opposite stationary contacts 19 and 10 (shown by dashed lines), respectively, at the next half period or at time of $(n+\frac{1}{2})T$, since the charge is preserved, the following equation is made up.

$$C_1V_1(nT)+C_3V_2\{(n-\tfrac{1}{2})T\}=(C_1+C_2+C_3)V_2\{(n+\tfrac{1}{2})T\} \quad (2)$$

In this equation, the voltages of $V_1(nT)$, $V_2\{(n-\frac{1}{2})T\}$ and $V_2\{(n+\frac{1}{2})T\}$ are functions of time and indicate instant voltages sampled at interval of nT, $(n-\frac{1}{2})T$ and $(n+\frac{1}{2})T$, respectively. That is, the functions $V_1(t)$ and $V_2(t)$ of time t are to be sampled by the impulse of the period T with the switches 7 and 14. Generally, the function $V^*(t)$ sampled at the period T of $V(t)$ is known to be expressed as shown by the following equation (3).

$$V^*(t) = \sum_{n=0}^{\infty} V(nT)\delta(t - nT) \quad (3)$$

If Laplace transformation is effected to this equation, it is transferred to $$V^*(S) = \sum_{n=1}^{\infty} V(nT)e^{-nsT}$$

The function V(Z) expressing this equation by using the delay unit $Z=e^{st}$ is as shown in the following equation (4).

$$V(Z) = \sum_{n=0}^{\infty} V(nT)Z^{-n} \quad (4)$$

Therefore, if the equation (1) is Z-transferred, it is as shown in the equation (5).

$$C_1V_1 + C_3V_2Z^{-1} = (C_1+C_2+C_3)V_2Z^{\frac{1}{2}} \quad (5)$$

Multiplying both sides of this equation by $Z^{-\frac{1}{2}}$, $V_2$ is given by the equation (6).

$$V_2 = \frac{C_1V_1Z^{-\frac{1}{2}}}{(C_1+C_2+C_3) - C_3Z^{-1}} \quad (6)$$

The amplification characteristic of $V_2$ is $$|V_2| = \frac{|C_1V_1e^{-\frac{1}{2}ST}|}{|(C_1+C_2+C_3) - C_3e^{-ST}|} \simeq$$

$$\frac{C_1V_1}{(C_1+C_2+C_3) - C_3(1-ST)} = \frac{C_1V_1}{(C_1+C_2)+C_3ST} = \quad (7)$$

$$\frac{\frac{T}{C_2}}{\frac{T}{C_2} + \frac{T}{C_1} + SC_3 \cdot \frac{T}{C_1} \cdot \frac{T}{C_2}}$$

Therefore, if $T/C_1 = R_1$ and $T/C_2 = R_2$, the above equation is expressed by the equation (8).

$$V_2 = \frac{R_2}{R_1 + R_2 + SC_3 \cdot R_1 \cdot R_2} \quad (8)$$

Figure 1:
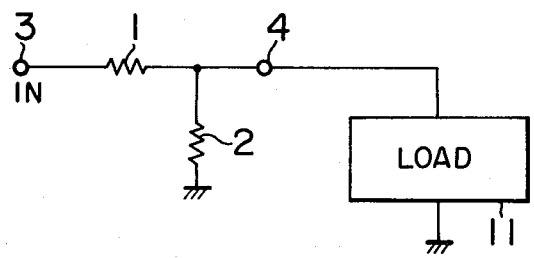
FIG. 1 is a circuit diagram of a conventional signal voltage dividing circuit.
Figure 2:
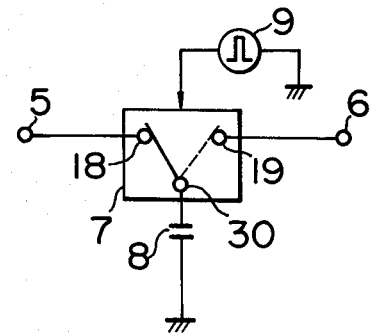
FIG. 2 is a circuit diagram illustrating the principle of a switched capacitor.
Figure 3:
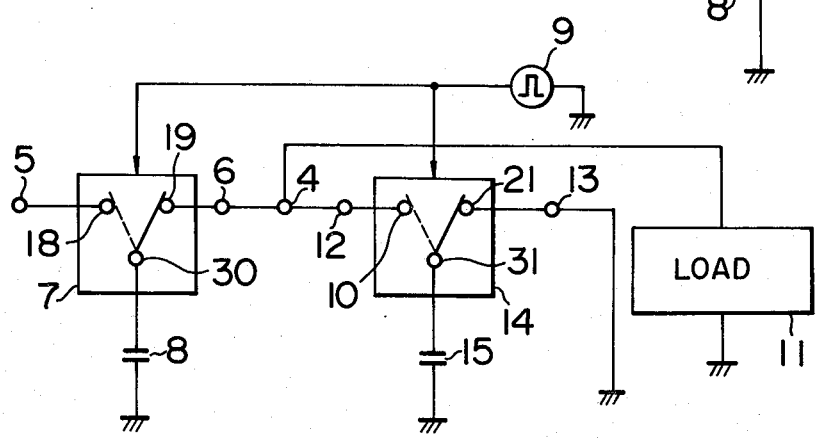
FIG. 3 is a circuit diagram as an approach to form a signal voltage dividing circuit including switched capacitors.
Figure 5:
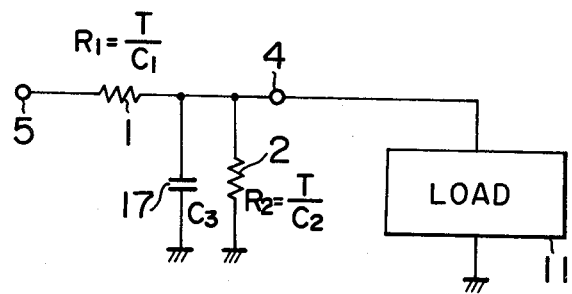
FIG. 5 is an equivalent circuit diagram of the signal voltage dividing circuit shown in FIG. 4.

This equation is equivalently expressed by the circuit of FIG. 5. A capacitor 17 is disregarded in the range of a low frequency, so that resistors $R_1$ and $R_2$ form the resistance division circuit as shown in FIG. 1.

The capacitor 17 should hold the previous voltage when the switches 7 and 14 are connected to the stationary contacts 18 and 21, respectively. In principle, the voltage can be reduced at any degree as far as the time constant defined by the capacitance of the capacitor 17 and the load resistance 11 is sufficiently large as compared with the clock period. Therefore, if the value of $C_3$ is sufficiently small for the ordinary frequency, it is quite equivalent to FIG. 1.

If the clock frequency is 100 KHz, $C_1=5$ PF and $C_2=10$ PF, high resistances of $R_1=2$ MΩ and $R_2=1$ MΩ can be realized. The occupation area of the capacitors of about 5 PF and 10 PF in the IC chip is very small, as compared with the IC resistors formed by a usual method.

From the equation (7), the dividing ratio can be defined by the capacitance ratio of the capacitors 8 and 15 as shown by the following equation.

$$\frac{C_1}{C_1+C_2} = \frac{1}{1+\frac{C_2}{C_1}} \quad (9)$$

Since it can be realized relatively with ease that the capacitance ratio between the capacitor with 10–20 PF or so and the capacitance with 1–20 PF or so is 1–5%, the dividing ratio can be extremely good.

Figure 6:
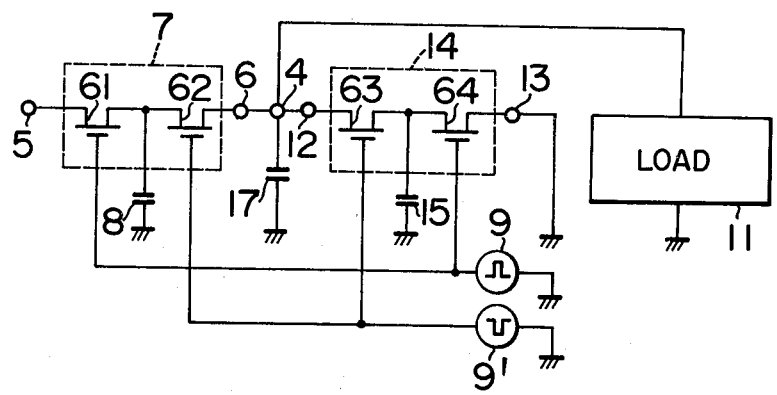
FIG. 6 is a practical circuit diagram of the signal voltage dividing circuit shown in FIG. 4.

The first and second switches 1 and 14 of the signal voltage dividing circuit in FIG. 4 can be semiconductor switches, respectively. FIG. 6 is a circuit diagram of the signal voltage dividing circuit which uses MOSFET's as switching elements in the dividing circuit of FIG. 4. First and second MOSFET's 61 and 62 constitute the first switch 7 (first switched capacitor), and third and fourth MOSFET's 63 and 64 constitute the second switch 14 (second switched capacitor). A clock signal of a first clock signal generator 9 is supplied to the gate electrodes of the first and fourth MOSFET's 61 and 64. A clock signal of a second clock signal generator 9' is supplied to the gate electrodes of the second and third MOSFET's 62 and 63. The clock signal of the first clock signal generator 9 is an opposite or inverse phase signal of the clock signal of the second clock signal generator 9'. Therefore, if the four MOSFET's 61–64 are formed of the same conductivity type FET's, the first and fourth MOSFET's 61, 64 and the second and third MOSFET's 62, 63 repeat to be alternately turned on and off. If the output clock signal of the first clock signal generator 9 is inverted through an inverter circuit to supply the output signal of the inverter circuit to the second and third MOSFET's 62 and 63, the second clock signal generator 9' can be omitted. Further, for example, if the first and fourth MOSFET's 61 and 64 are composed of P channel type MOSFET's and the second and third MOSFET's 62 and 63 are formed of N channel type MOSFET, the four MOSFET's 61–64 can be controlled by the signal of the first clock signal generator 9.

Figure 7:
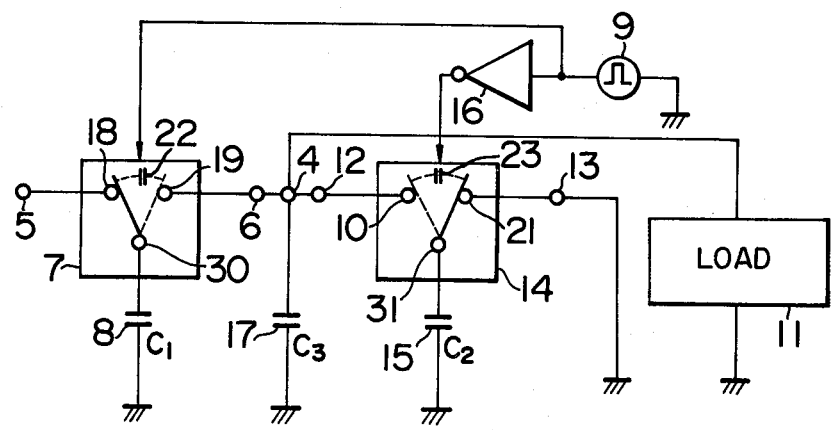
FIG. 7 is a circuit diagram for illustrating existence of stray capacitances in the signal voltage dividing circuit shown in FIG. 4.

Although the signal voltage dividing circuit shown in FIG. 4 is satisfactorily operated in principle, it can be seen in a studying stage that when the value of the holding capacitor 17 is reduced, a stray capacitance 22 between one stationary contact 18 and the other stationary contact 19 of the switch 7 and a stray capacitance 23 between one stationary contact 10 and the other stationary contact 21 as shown in FIG. 7 affect the circuit operation.

In other words, as shown in FIG. 7, when the movable contact of the switch 7 is connected to the one stationary contact 18 of the switch 7 and the movable contact of the switch 14 is connected to the other stationary contact 21 of the switch 14, the input signal from the terminal 5 develops on the terminal 4 through the stray capacitance 22 to be divided by the stray capacitance 22 and the parallel capacitance of the holding capacitor 17 and the stray capacitance 23. If the values of the stray capacitance 22 and 23 are $C_{s1}$ and $C_{s2}$, respectively, the dividing ratio is $$\frac{C_{s1}}{C_{s1} + C_{s2} + C_3}.$$

Consequently, if the value $C_3$ of the holding capacitor 17 is small, the dividing ratio can not be as shown by the equation (9) and the exact dividing circuit can not be realized. In order to realize the exact dividing circuit, it is necessary that the value of the holding capacitor is sufficiently large as compared with the value of the stray capacitances 22 and 23, thereby disadvantageously increasing the chip occupation area for the holding capacitor.

Figure 8:
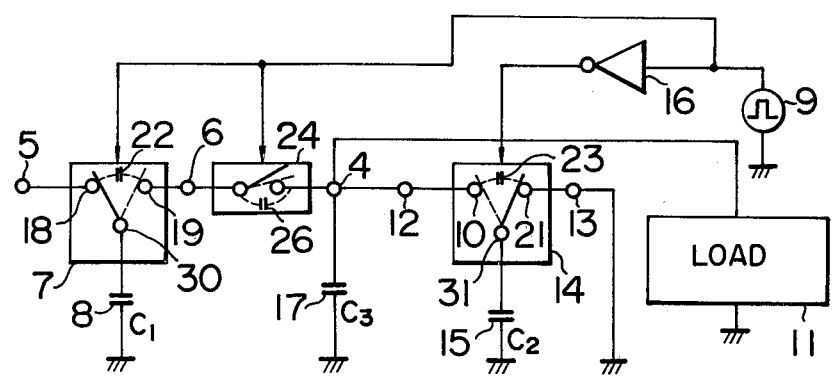
FIG. 8 is a circuit diagram showing another embodiment of the signal voltage dividing circuit according to the present invention.

FIG. 8 shows another embodiment of the present invention, in which like reference numbers are attached to components having the same functions as those of the components in FIG. 4. In FIG. 8, in order to avoid the influence of the stray capacitance 22 of the switch 7, a third switch 24 is connected between the terminals 6 and 4. When the movable contact of the switch 7 is connected to the stationary contact 19 thereof and the movable contact of the switch 14 is connected to the stationary contact 10 thereof, the switch 24 is controlled by the clock signal 9 so that the switch 24 is turned on. With such a circuit configuration, even if there is the stray capacitance 22 when the movable contact of the switch 7 is connected to the stationary contact 18, since the signal transmission path is cut off by the switch 24, the input signal is not transmitted to the terminal 4.

Further, even if the switch 24 has a stray capacitance 26, there is less influence since the stray capacitance 26 is connected in series to the stray capacitance 22. In order to further reduce the influence, a further switch may be inserted in series, operating both the switches simultaneously.

The signal voltage dividing circuit in FIG. 4 is equivalent to the circuit in FIG. 5 and includes the holding capacitor 17 connected in parallel with the resistor 2. If the signal supplied to the terminal 5 is a high frequency signal, the impedance of the holding capacitor 17 is reduced and the holding capacitor 17 can not be neglected. Therefore, in the case where the high frequency signal is supplied to the circuit, it is necessary that the holding capacitor 17 is small to increase the impedance thereof. However, if the holding capacitor 17 is small, there is the influence by the stray capacitance of the second switch 14. In the circuit shown in FIG. 8, the influence of the stray capacitance 22 of the first switch 7 can be prevented by the third switch 23. However, the stray capacitance 23 of the second switch 14 affects the holding capacitor since the holding capacitor 17 is connected to the second switch 14.

Figure 9:
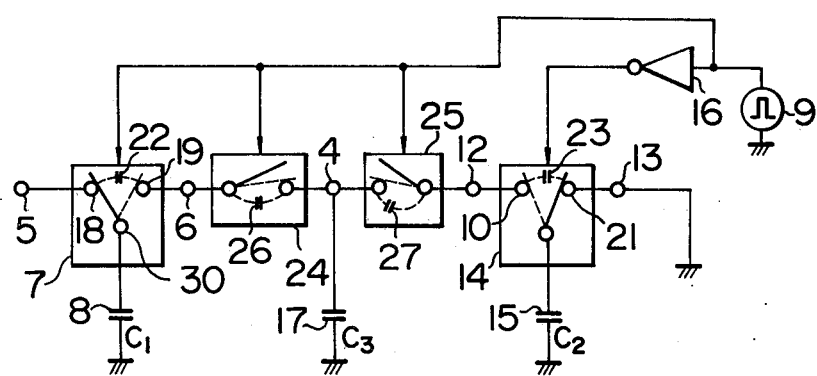
FIG. 9 is a circuit diagram showing a further embodiment of the signal voltage dividing circuit according to the present invention.

FIG. 9 shows a further embodiment in which it is prevented that the stray capacitance 23 of the second switch 14 affects the holding capacitor 17. A fourth switch 25 is connected between the output terminal 4 and the second switch 14 and controlled to be turned on and off by the output signal of the clock signal generator 9. When the movable contact of the switch 14 is connected to the stationary contact thereof, the switch 25 is off and when the movable contact of the switch 14 is connected to the stationary contact 10, the switch is on. Thus, since the stray capacitance 23 of the second switch 14 is separated from the holding capacitor 17 by the fourth switch 25, it can be prevented that the stray capacitance 23 of the second switch 14 adversely affects the holding capacitor 17. Furthermore, since the stray capacitance 27 of the fourth switch 25 is connected in series to the stray capacitance 23 of the second switch 14, the stray capacitance 27 can be neglected.

Figure 10:
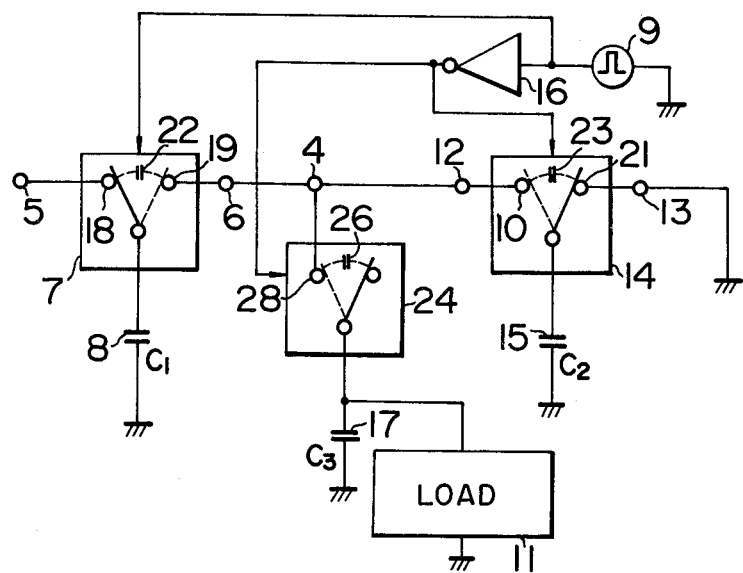
FIG. 10 is a circuit diagram showing still another embodiment of the signal voltage dividing circuit according to the present invention.

FIG. 10 shows a further embodiment of the signal voltage dividing circuit according to the present invention, in which the third switch 24 is connected between the output terminal 4 and the load 11 and is controlled to be turned on and off by the clock signal of the clock signal generator 9. When the movable contact of the switch 7 is connected to the stationary contact 19 and the movable contact of the switch 14 is connected to the stationary contact 10, the third switch 24 is switched by the clock signal 9 so that the movable contact of the third switch 24 is connected to the stationary contact 28, and the voltage of the terminal 4 is sampled by the switch 24 to hold the voltage in the holding capacitor 17. With such a circuit configuration, even if the switches 7, 14 and 24 have the stray capacitances 22, 23 and 26, respectively, there is less influence to the signal supplied to the load. Namely, when the switches 14 and 24 are connected to each contact as shown in the figure, a voltage signal divided by the stray capacitances 22 and 23 appears on the terminal 4. However, this voltage signal is prevented to be transmitted to the load 11. When the movable contact of the switch 7 is connected to the stationary contact 19 and the movable contact of the switch 14 is connected to the stationary contact 10, the movable contact of the switch 24 is connected to the stationary contact 28 and the voltage at the terminal 4 is held in the holding capacitor 17. Therefore, the input signal is to be divided in principle as shown in the equation (9). Thus, if the capacitor ratio shown in the equation (9) is exactly effected, the accuracy of dividing voltage is extremely high. It will be apparent that the influence of the stray capacitance 26 between the contacts of the third switch 25 is reduced by half.

In order to further decrease the influence of the stray capacitance, there may be provided a plurality of switches connected in series to each other and operated in phase with the switch 24, the plurality of switches be connected to the holding capacitor 17 and the load 11, so that the exact signal voltage dividing circuit which is equivalently composed of high resistances and is not perfectly affected by the stray capacitances can be realized.

Figure 11A:
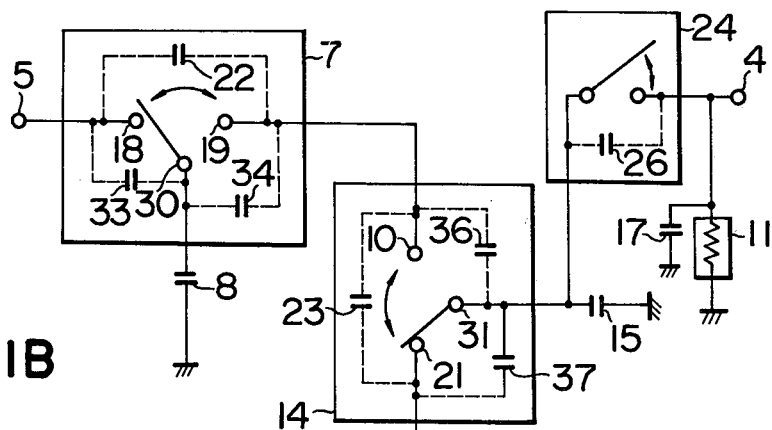
FIG. 11A is a circuit diagram showing a further embodiment of the signal voltage dividing circuit according to the present invention.
Figure 11B:
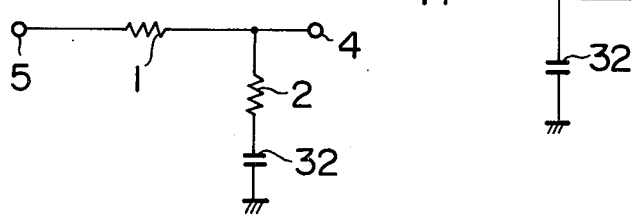
FIG. 11B is an equivalent circuit diagram of the signal voltage dividing circuit shown in FIG. 11A.

FIG. 11A shows a further embodiment of the signal voltage dividing circuit according to the present invention. The signal voltage dividing circuit is to obtain a circuit in which a resistor 2 is connected to ground through a capacitor 32 connected in series to the resistor 2 as shown in FIG. 11B. This signal voltage dividing circuit is used, for example, as a reproduction equalizer circuit for an audio circuit of a magnetic recording and reproducing apparatus in order to obtain a flat frequency characteristic by attenuating upon reproduction an amplitude of an audio signal in the high frequency range which is recorded in a magnetic tape with a large amplitude as compared with an amplitude in the low and middle frequency range.

The signal voltage dividing circuit shown in FIG. 11A has the stray capacitances in the first and second switches 7 and 14 as described with reference to FIGS. 9 and 10. In FIG. 11A, there are shown another stray capacitance 33 between the one stationary contact 18 and the movable contact 30 of the switch 7 and a further stray capacitance 34 between the other stationary contact 19 and the movable contact 30 in addition to the stray capacitance 22 between the one stationary contact 18 and the other stationary contact 19. In the same manner, there are also shown in the second switch 14 a stray capacitance 23 between the two stationary contacts 10 and 21, a stray capacitance 36 between the one stationary contact 10 and the movable contact 31, and a stray capacitance 27 between the one stationary contact 21 and the movable contact 31. Since the audio signal is supplied to the load through the stray capacitance, the audio signal in the high frequency range is not sufficiently attenuated in the case of constituting the reproduction equalizer circuit, so that the frequency characteristic is different from a recording equalizer circuit and the flat frequency characteristic can not be obtained.

In the signal voltage dividing circuit shown in FIG. 11A, the third switch 24 is connected between the movable contact of the second switch 14 and the load 11. When the movable contact of the first switch 7 is connected to the one stationary contact 18 and the movable contact of the second switch 14 is connected to the other stationary contact 21, the third switch 24 is off, while when the movable contact of the first switch 7 is connected to the other contact 19 and the movable contact of the second switch 14 is connected to the one stationary contact 10, the third switch 24 is on. The operation of the third switch 24 is controlled in synchronism with the first and second switches 7 and 14 by the clock signal of the clock pulse generator in the same manner as the other embodiments. In this circuit, the input signal is transmitted to the output terminal through the stray capacitances 22, 33 and 34 of the first switch 7, the stray capacitance 36 of the second switch 14 and the stray capacitance 26 of the third switch 24. However, since the impendance between the input and output terminal is large due to the series-connected stray capacitances and the capacitor 15 having a very large capacitance value as compared with the stray capacitances is connected to the junction between the stray capacitances 36 and 26, the input signal transmitted to the output terminal through the stray capacitances is greatly attenuated.

As described above, if the reproducing equalizer circuit is constituted, the frequency characteristic of the reproducing equalizer circuit can be coincident with the frequency characteristic of the recording equalizer circuit.

What we claim is:

1. A signal voltage dividing circuit comprising:
    first and second switched capacitors each having a first terminal, a second terminal, a third terminal and a capacitor connected to said third terminal which is selectively connected to said first or second terminal;
    clock signal generating means for generating a clock signal and thereby driving said first and second switched capacitors in opposite phase with each other;
    an input terminal connected to said first terminal of said first switched capacitor;
    means for connecting said second terminal of said first switched capacitor to said first terminal of said second switched capacitor;
    an output terminal connected to one of the terminals of said second switched capacitor;
    means for connecting said second terminal of said second switched capacitor to a reference potential; and
    a holding capacitor connected between said output terminal and said reference potential.

2. A signal voltage dividing circuit according to claim 1, wherein said second terminal of said second switched capacitor is connected to said reference potential through a capacitor.

3. A signal voltage dividing circuit according to claim 1, wherein said output terminal is connected to said second switched capacitor through a switching element which is driven in the same phase as said second switched capacitor and is connected between the junction of said second terminal of said first switched capacitor and said first terminal of said second switched capacitor and said output terminal.

4. A signal voltage dividing circuit according to claim 1, wherein said output terminal is connected to said second switched capacitor through a switching element which is driven in the same phase as said second switched capacitor and is connected between said third terminal of said second switched capacitor and said output terminal.

5. A signal voltage dividing circuit comprising:
    first and second switched capacitors, each having an input terminal, an output terminal and a capacitor connected selectively to said input terminal or said output terminal, and connected in series between a signal input terminal and a reference potential;
    clock signal generating means for generating a clock signal and thereby driving said first and second switched capacitors in opposite phase with each other; and
    a holding capacitor connected between the junction of said first and second switched capacitors and said reference potential;
    an input signal being supplied between said signal input terminal and said reference potential to produce an output signal between said junction of said first and second switched capacitors and said reference potential.

6. A signal voltage dividing circuit comprising:
    first and second switched capacitors each having an input terminal, an output terminal and a capacitor connected selectively to said input terminal or output terminal;
    said first and second switched capacitors being connected in series so that said output terminal of said first switched capacitor is connected to said input terminal of said second switched capacitor;
    clock pulse generating means for generating clock pulses and thereby driving said first and second switched capacitors in opposite phase with each other; and
    a holding capacitor connected between the junction of said first and second switched capacitors and a reference potential;
    an input signal being supplied between said input terminal of said first switched capacitor and said output terminal of said second switched capacitor to produce an output signal from said junction of said first and second switched capacitors.

7. A signal voltage dividing circuit comprising:
    first and second switched capacitors each having an input terminal, an output terminal and a capacitor connected selectively to said input terminal or output terminal;
    clock signal generating means for generating a clock signal and thereby driving said first and second switched capacitors in opposite phase with each other;
    a first switching element which is driven by the output signal of said clock signal generating means and connected between said output terminal of said first switched capacitor and said input terminal of said second switched capacitor; and
    a holding capacitor connected to the junction of said switching element and said input terminal of said second switched capacitor;
    an input signal being supplied between said input terminal of said first switched capacitor and said output terminal of said second switched capacitor to produce an output from said junction of said switching element and said input terminal of said second switched capacitor.

8. A signal voltage dividing circuit according to claim 7 wherein a second switching element which is driven in the same phase as said first switching element is connected between said first switching element and said input terminal of said second switched capacitor and said holding capacitor is connected to the junction of said first switching element and said second switching element.

9. A signal voltage dividing circuit comprising:
    first and second switched capacitors each having a first terminal, a second terminal, a third terminal and a capacitor connected to said third terminal which is selectively connected to said first or second terminal;

clock signal generating means for generating a clock signal and thereby driving said first and second switched capacitor in opposite phase with each other;

an output terminal;

a switching element which is connected between said output terminal and said third terminal of said second switched capacitor and is driven by the output signal of said clock signal generating means;

a holding capacitor connected between said output terminal and a reference potential;

means for connecting said second terminal of said first switched capacitor and said first terminal of said second switched capacitor; and a capacitor connected between said second terminal of said second switched capacitor and said reference potential;

an input signal being supplied to said first terminal of said first switched capacitor to produce an output signal from said output terminal.

10. A signal voltage dividing circuit comprising:

first and second switched capacitors each including a pair of switching elements which are alternately turned on and off and a capacitor, said capacitor being charged through one switching element of said pair of switching elements when said one switching element is on, while said capacitor being discharged through the other switching element of said pair of switching elements when said other switching element is off;

driving means for driving said one switching element of said first switched capacitor and said other switching element of said second switched capacitor in phase and for driving said other switching element of said first switched capacitor and said one switching element of said second switched capacitor;

an output terminal connected to said other switching element of said first switched capacitor and said one switching element of said second switched capacitor; and a holding capacitor connected between said output terminal and a reference potential;

an input signal being supplied between said one switching element of said first switched capacitor and said other switching element of said second switched capacitor to produce an output signal from said output terminal.

* * * * *